United States Patent
Chao et al.

(10) Patent No.: US 10,090,291 B2
(45) Date of Patent: Oct. 2, 2018

(54) ELECTROSTATIC DISCHARGE PROTECTION SEMICONDUCTOR DEVICE AND LAYOUT STRUCTURE OF ESD PROTECTION SEMICONDUCTOR DEVICE

(71) Applicant: UNITED MICROELECTRONICS CORP., Hsin-Chu (TW)

(72) Inventors: Mei-Ling Chao, Tainan (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 32 days.

(21) Appl. No.: 15/138,226

(22) Filed: Apr. 26, 2016

(65) Prior Publication Data

US 2017/0309613 A1    Oct. 26, 2017

(51) Int. Cl.
*H01L 27/02* (2006.01)
*H01L 29/417* (2006.01)
(Continued)

(52) U.S. Cl.
CPC ........ *H01L 27/0277* (2013.01); *H01L 27/027* (2013.01); *H01L 27/0248* (2013.01); *H01L 27/0251* (2013.01); *H01L 27/0255* (2013.01); *H01L 27/0259* (2013.01); *H01L 27/0262* (2013.01); *H01L 27/0274* (2013.01); *H01L 29/0619* (2013.01); *H01L 29/0626* (2013.01); *H01L 29/0692* (2013.01);
(Continued)

(58) Field of Classification Search
CPC ............. H01L 27/0266; H01L 27/0255; H01L 27/0248; H01L 29/0619; H01L 29/0615; H01L 29/7823; H01L 27/0262; H01L 29/66121; H01L 29/41725; H01L 29/0653; H01L 29/0843; H01L 27/0251; H01L 27/0259; H01L 29/0847; H01L 29/0626; H01L 29/0692; H01L 29/1083; H01L 29/1087; H01L 21/761; H01L 27/0296

See application file for complete search history.

(56) References Cited

U.S. PATENT DOCUMENTS 5,596,216 A * 1/1997 Yanagigawa ....... H01L 27/0255
                                                         257/355
6,469,354 B1 * 10/2002 Hirata ................. H01L 27/0266
                                                         257/358
(Continued)

*Primary Examiner* — Yu Chen
*Assistant Examiner* — Pauline Vu
(74) *Attorney, Agent, or Firm* — Winston Hsu

(57) ABSTRACT

A layout structure of an ESD protection semiconductor device includes a substrate, a first doped region, a pair of second doped regions, a pair of third doped regions, at least a first gate structure formed within the first doped region, and a drain region and a first source region formed at two sides of the first gate structure. The substrate, the first doped region and the third doped regions include a first conductivity type. The second doped regions, the drain region and the first source region include a second conductivity type complementary to the first conductivity type. The first doped region includes a pair of lateral portions and a pair of vertical portions. The pair of second doped regions is formed under the pair of lateral portions, and the pair of third doped regions is formed under the pair of vertical portions.

16 Claims, 6 Drawing Sheets

(51) Int. Cl.
*H01L 29/06* (2006.01)
*H01L 29/08* (2006.01)
*H01L 29/10* (2006.01)

(52) U.S. Cl.
CPC ...... *H01L 29/0843* (2013.01); *H01L 29/0847* (2013.01); *H01L 29/1083* (2013.01); *H01L 29/1087* (2013.01); *H01L 29/41725* (2013.01)

(56) References Cited

U.S. PATENT DOCUMENTS

| | | | | |
|---|---|---|---|---|
| 6,621,133 B1* | 9/2003 | Chen | .................. | H01L 27/0266 257/350 |
| 8,080,832 B1* | 12/2011 | Boyd | .................. | H01L 27/0262 257/173 |
| 8,217,461 B1* | 7/2012 | Chu | .................. | H01L 23/62 257/355 |
| 2001/0033004 A1* | 10/2001 | Lin | .................. | H01L 27/0251 257/360 |
| 2002/0050615 A1* | 5/2002 | Ker | .................. | H01L 27/0251 257/355 |
| 2002/0076876 A1* | 6/2002 | Ker | .................. | H01L 21/823425 438/218 |
| 2002/0122280 A1* | 9/2002 | Ker | .................. | H01L 27/0262 361/56 |
| 2003/0047786 A1* | 3/2003 | Lee | .................. | H01L 27/0266 257/355 |
| 2003/0174452 A1* | 9/2003 | Chen | .................. | H01L 27/0255 361/56 |
| 2005/0082618 A1* | 4/2005 | Wu | .................. | H01L 27/0266 257/355 |
| 2006/0226499 A1* | 10/2006 | Shimizu | .................. | H01L 27/0255 257/409 |
| 2007/0187782 A1* | 8/2007 | Kato | .................. | H01L 29/0619 257/409 |
| 2008/0079078 A1* | 4/2008 | Noguchi | .................. | H01L 29/7804 257/355 |
| 2008/0079110 A1* | 4/2008 | Kikuchi | .................. | H01L 27/0255 257/476 |
| 2009/0166721 A1* | 7/2009 | Denison | .................. | H01L 27/0262 257/328 |
| 2009/0267154 A1* | 10/2009 | Boselli | .................. | H01L 27/0259 257/355 |
| 2010/0102379 A1* | 4/2010 | Wang | .................. | H01L 29/0696 257/328 |
| 2010/0289057 A1* | 11/2010 | Sheu | .................. | H01L 27/0251 257/133 |
| 2011/0292553 A1* | 12/2011 | Son | .................. | H01L 27/027 361/56 |
| 2012/0265474 A1* | 10/2012 | Rearick | .................. | G06F 19/22 702/104 |
| 2013/0026550 A1* | 1/2013 | Yoshioka | .................. | H01L 29/861 257/296 |
| 2013/0049112 A1* | 2/2013 | Lai | .................. | H01L 29/7835 257/337 |
| 2013/0181211 A1* | 7/2013 | Chen | .................. | H01L 27/0262 257/43 |
| 2013/0207184 A1* | 8/2013 | Chen | .................. | H01L 29/7835 257/339 |
| 2014/0138735 A1* | 5/2014 | Clarke | .................. | H01L 29/0692 257/124 |
| 2014/0159206 A1* | 6/2014 | Hsu | .................. | H01L 29/735 257/565 |
| 2014/0183596 A1* | 7/2014 | Wang | .................. | H01L 29/7436 257/141 |
| 2016/0086933 A1* | 3/2016 | Chen | .................. | H01L 27/0248 361/220 |

* cited by examiner

ELECTROSTATIC DISCHARGE PROTECTION SEMICONDUCTOR DEVICE AND LAYOUT STRUCTURE OF ESD PROTECTION SEMICONDUCTOR DEVICE

BACKGROUND OF THE INVENTION

1. Field of the Invention

The present invention relates to an electrostatic discharge (hereinafter abbreviated as ESD) protection semiconductor device and a layout structure of an ESD protection semiconductor device.

2. Description of the Prior Art

With the advancement of technology, the development of semiconductor process is ongoing. A modern chip is therefore allowed to have a plurality of various electronic circuits configured within. For example, the integrated circuits (ICs) integrated in the chip(s) can be divided into core circuits and input/output (hereinafter abbreviated as I/O) circuits, and the core circuits and the I/O circuits are respectively driven by different power supply sources with different voltages. And for receiving the externally provided power, pads for core circuits and I/O circuits are required.

However, it is found that electrostatic charges are easily transferred to the inner circuits in the chip by those pads during processes such as manufacturing, testing, packaging, and delivering, etc. The electrostatic charges impact and damage the inner circuits in the chip, and this unwanted condition is named electrostatic discharge (ESD). As products based on ICs become more delicate, they also become more vulnerable to the impacts from external environment. And thus, it is assumed that ESD is a constant threat to the modern electronics. Models related to ESD tolerance are divided into human body model (HBM) and machine model (MM). For commercial IC products, the general ESD specification is required that IC products must pass these tests, for example, MM ESD tolerance greater than 200V.

It is found that +200V machine model is easy to be achieved while −200V not. Furthermore, it is found that ESD damaged areas caused by contact spiking are often located at the drain contacts around the two ends of the drain region, and this issue is more serious in machine model ESD tests due to the faster rise time and the larger current of the ESD pulse. Therefore, an improved ESD semiconductor device is needed to address the aforementioned deficiency and inadequacies.

SUMMARY OF THE INVENTION

According to the claimed invention, a layout structure of an ESD protection semiconductor device is provided. The layout structure of the ESD protection semiconductor device includes a substrate including a first conductivity type, a first doped region including the first conductivity type, a pair of second doped regions including a second conductivity type complementary to the first conductivity type, a pair of third doped regions including the first conductivity type, at least a first gate structure formed on the substrate within the first doped region, and a drain region and a first source region formed in the substrate at two sides of the first gate structure. And the drain region and the first source region include the second conductivity type. The first doped region includes a pair of lateral portions and a pair of vertical portions, and the pair of lateral portions and the pair of vertical portions are perpendicular to each other to form a frame in the substrate. The pair of second doped regions are formed under the pair of lateral portions of the first doped region, and the pair of third doped regions are formed under the pair of vertical portions of the first doped region.

According to the claimed invention, an ESD protection semiconductor device is provided. The ESD protection semiconductor device includes a substrate, a gate structure positioned on the substrate, a drain region and a source region formed at two sides of the gate structure in the substrate, a pair of first doped regions formed in the substrate, a second doped region formed under one of the pair of first doped regions, and a third doped region formed under the other first doped region. The substrate, the first doped regions and the third doped region include a first conductivity type, and the drain region, the source region and the second doped region include a second conductivity type. And the first conductivity type and the second conductivity type are complementary to each other. The gate structure, the drain region and the source region are formed in between the pair of first doped regions.

According to the ESD protection semiconductor device and the layout structure of the ESD protection semiconductor device provided by the present invention, the second doped regions, which are complementary to the first doped region, are formed under the pair of lateral portions of the first doped region and thus are near two ends of the drain region. Consequently, a silicon controlled rectifier (hereinafter abbreviated as SCR) is obtained due to the second doped regions. As a result, currents are forced to avoid this SCR path. That is, the currents are forced to avoid vertical paths between the drain region and the lateral portions of the first doped region, and lateral paths between the drain region and the lateral portions of the first doped region are preferred. Consequently, contact spiking which is often located at the drain contacts around the two ends of the drain region is prevented and thus machine model of the ESD protection semiconductor device is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
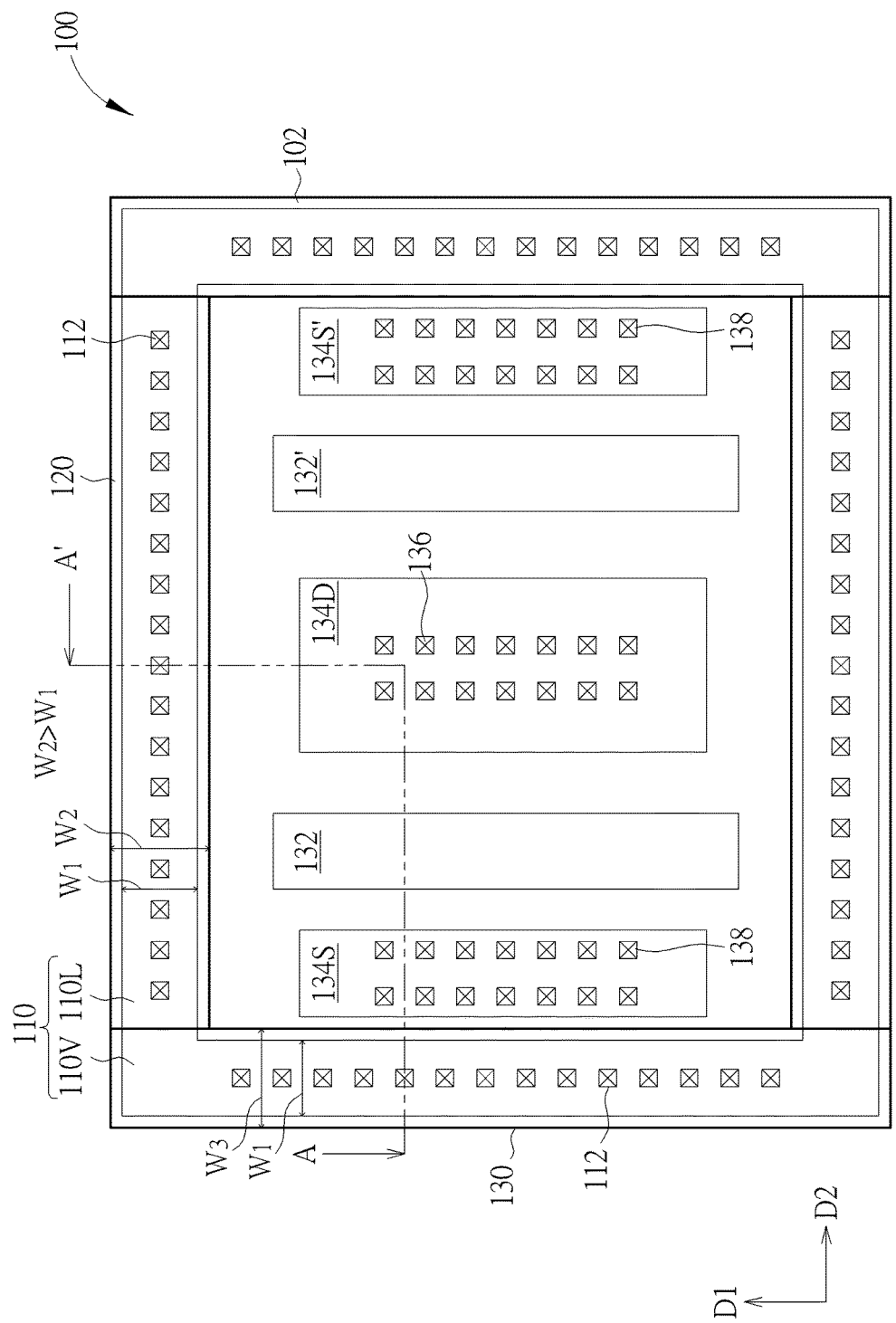
FIG. 1 is a schematic drawing illustrating a layout structure of an ESD protection semiconductor device provided by a first preferred embodiment of the present invention.
Figure 2:
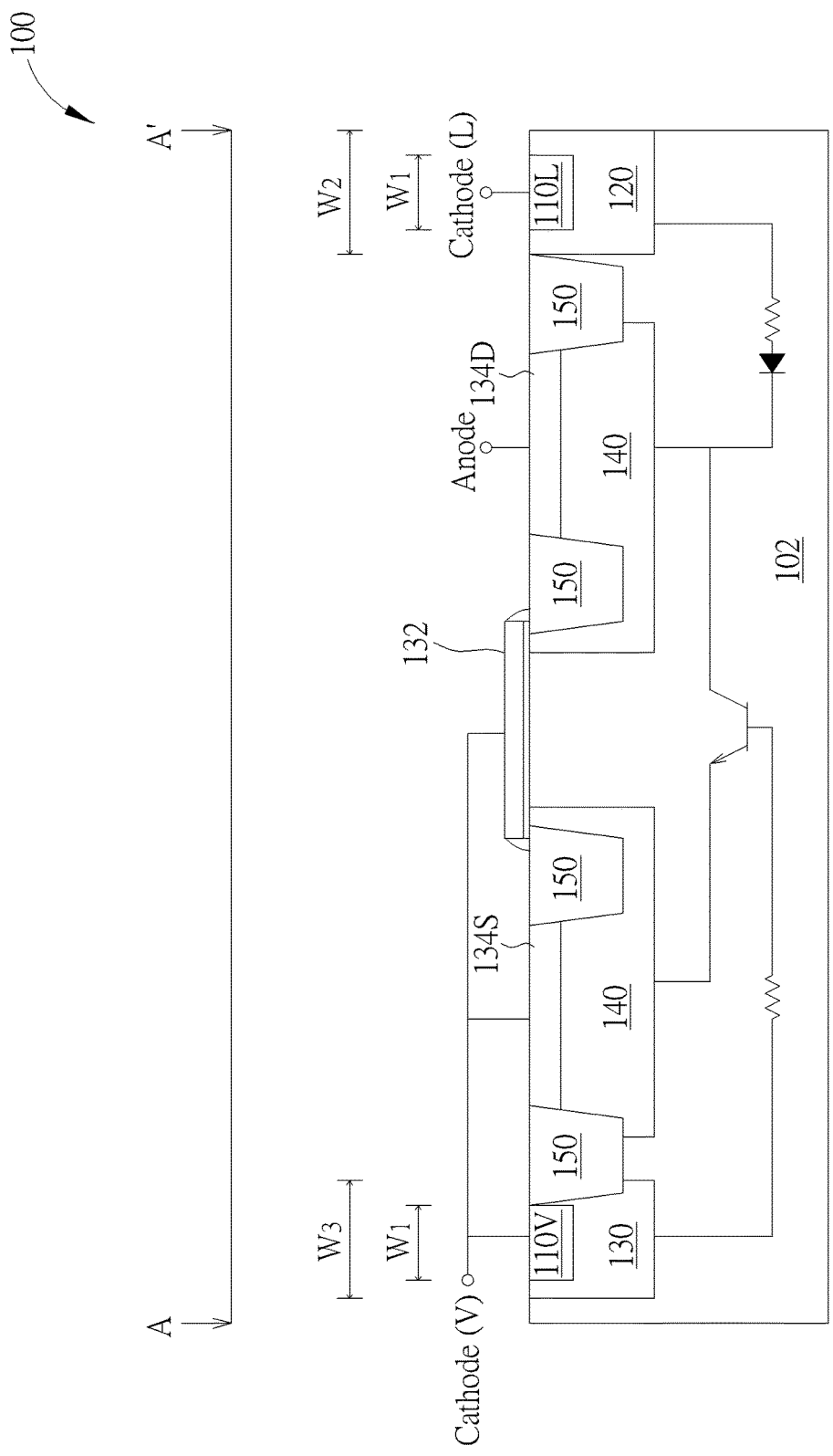
FIG. 2 is a schematic drawing illustrating the ESD protection semiconductor device provided by the first preferred embodiment, and a cross-sectional view taken along a line A-A' of FIG. 1.

Please refer to FIGS. 1 and 2, wherein FIG. 1 is a schematic drawing illustrating a layout structure of an ESD protection semiconductor device provided by a first preferred embodiment of the present invention, and FIG. 2 is a schematic drawing illustrating the ESD protection semiconductor device provided by the first preferred embodiment. Particularly, FIG. 2 is a cross-sectional view taken along a line A-A' of FIG. 1. As shown in FIGS. 1 and 2, the preferred embodiment provides a layout structure of an ESD protection semiconductor device 100 and an ESD protection semiconductor device 100. The ESD protection semiconductor device 100 and its layout structure 100 include a substrate 102. The substrate 102 includes a first conductivity type. In some embodiments of the present invention, the substrate 102 can be a well region formed in a wafer, but not limited to this. According to the preferred embodiment, the first conductivity type is a p type. In other words, the substrate 102 can be a p-well in the preferred embodiment, but not limited to this.

Please still refer to FIGS. 1 and 2. A first doped region 110 is disposed in the substrate 102. It is noteworthy that the first doped region 110 includes a pair of vertical portions 110V and a pair of lateral portions 110L. The vertical portions 110V are extended along a first direction D1, the lateral portions 110L are extended along a second direction D2, and the first direction D1 is perpendicular to the second direction D2. As shown in FIG. 1, the pair of vertical portions 110V are therefore perpendicular to the pair of lateral portions 110L to form a frame in the substrate 102. Furthermore, a plurality of first contacts 112 are formed in the first doped region 110. The first doped region 110 includes the first conductivity type. Accordingly, the first doped region 110 is a p-pick up in the preferred embodiment. As shown in FIG. 1, a pair of second doped regions 120 is formed under the lateral portions 110L of the first doped region 110. Thus the pair of second doped regions 120 is extended along the second direction D2. The second doped regions 120 include a second conductivity type. The first conductivity type and the second conductivity type are complementary to each other. Accordingly, the second conductivity type is an n type in the preferred embodiment. However, it is well-known to those skilled in the art that the first conductivity type can be a p type and the second conductivity type can be an n type. In the preferred embodiment, a width $W_2$ of the second doped regions 120 is larger than a width $W_1$ of the lateral portions 110L of the first doped region 110. A pair of third doped regions 130 is formed under the vertical portions 110V of the first doped region 110. Thus the pair of third doped regions 130 is extended along the first direction D1. And the third doped regions 130 include the first conductivity type. A width $W_3$ of the third doped regions 130 is larger than the width $W_1$ of the vertical portions 110V of the first doped region 110.

Please still refer to FIGS. 1 and 2. The ESD protection semiconductor device 100 further includes a first gate structure 132 and a second gate structure 132' formed on the substrate 102. Particularly, the first gate structure 132 and the second gate structure 132' are formed within the first doped region 110. In other words, the first gate structure 132 and the second gate structure 132' are disposed in an area defined within the frame-shaped first doped region 110. And the first gate structure 132 and the second gate structure 132' are extended along the first direction D1. Therefore, the first gate structure 132 and the second gate structure 132' are parallel with the vertical portions 110V of the first doped region 110 and perpendicular to the lateral portions 110L of the first doped region 110. The first gate structure 132 and the second gate structure 132' include a gate conductive layer and a gate dielectric layer. Since materials of the gate conductive layer and the gate dielectric layer are well-known to those skilled in the art, those details are omitted herein in the interest of brevity.

Furthermore, the ESD protection semiconductor device 100 includes a drain region 134D, and the drain region 134D is formed in between the first gate structure 132 and the second gate structure 132'. The ESD protection semiconductor device 100 further includes a first source region 134S and a second source region 134S', and the first gate structure 132 and the second gate structure 132' are formed in between the first source region 134S and the second source region 134S' as shown in FIG. 1. Furthermore, the drain region 134D and the first source region 134S are formed at two sides of the first gate structure 132 while the drain region 134D and the second source region 134S' are formed at two sides of the second gate structure 132'. The drain region 134D, the first source region 134S, and the second source region 134S' are all extended along the first direction D1. As shown in FIG. 1, the drain region 134D, the first source region 134S, and the second source region 134S' are parallel with the vertical portions 110V of the first doped region 110 and the pair of third doped regions 130. The drain region 134D, the first source region 134S, and the second source region 134S' are perpendicular to the lateral portions 110L of the first doped region 110 and the pair of second doped regions 120. The drain region 134D, the first source region 134S and the second source region 134S' include the second conductivity type.

Additionally, a plurality of drain contacts 136 is formed in the drain region 134D, and a plurality of source contacts 138 is formed in the first source region 134S and the second source region 134S', as shown in FIG. 1.

As shown in FIG. 2, the ESD protection semiconductor device 100 includes a plurality of well regions 140 formed in the substrate 102. Particularly, the well regions 140 are respectively formed under the first/second source region 134S/134S' and the drain region 134D. The well regions 140 include the second conductivity type. It is noteworthy that the second doped regions 120, the first/second source region 134S/134S', the drain region 134, and the well regions 140 all include the second conductivity type. However, a concentration of the second doped regions 120 is equal to or smaller than a concentration of the first/second source region 134S/134S' and the drain region 134D, and the concentration of the second doped regions 120 is equal or larger than a concentration of the well regions 140. Additionally, the first and second gate structures 132 and 132', the drain region 134D, the first and second source regions 134S and 134S', and the well regions 140 are all formed in between the pair of vertical portions 110V of the first doped region 110. In the same concept, the first and second gate structures 132 and 132', the drain region 134D, the first and second source regions 134S and 134S', and the well regions 140 are also all formed in between the pair of lateral portions 110L of the first doped region 110.

Moreover, the ESD protection semiconductor device 100 includes a plurality of isolation structures 150 formed in the substrate 102. As shown in FIG. 2, one of the isolation structures 150 is formed in between the first gate structure 132 and the first source region 134S, and one of the isolation structures 150 is formed in between the first gate structure 132 and the drain region 134D. Equally, one of the isolation structures 150 is formed in between the second gate structure 132' and the second source region 134S', and one of the isolation structures 150 is formed in between the drain region 134D and the second gate structure 132'. Furthermore, one of the isolation structures 150 is formed in between the first source region 134S and the first doped region 110 (and the third doped region 130 formed underneath). And one of the isolation structures 150 is formed in between the drain region 134D and the first doped region 110 (and the second doped region 120 formed underneath). Additionally, the well regions 140 are spaced apart from the second doped regions 120 and the third doped regions 130 by the isolation structures 150 and the substrate 102 as shown in FIG. 2. Please note that for clarifying the spatial relationship between the drain region 134D, the first/second source region 134S/134S', the first doped region 110, the second doped regions 120, and the third doped regions 130, all the isolation structures 150 are omitted from FIG. 1.

According to the ESD protection semiconductor device 100 and its layout structure 100, the second doped regions 120 are provided and formed under the lateral portions 110L of the first doped region 110, which are near the two ends of the drain region 134D as shown in FIG. 1. More important, the lateral portions 110L of the first doped region 110, the second doped regions 120, the substrate 102, and the well region 140/the drain region 134D form a SCR as shown in FIG. 2. Consequently, currents are forced to avoid this SCR path. That is, currents are forced to avoid vertical paths between the drain region 134D and the lateral portions 110L of the first doped region 110, and lateral paths between the drain region 134D and the vertical portions 110V of the first doped region 110 are preferred. Since path lengths between the drain contacts 136 and the vertical portions 110V of the first doped region 110 are all the same, contact spiking which is often located at the drain contacts 136 around the two ends of the drain region 134D is prevented and thus machine model of the ESD protection semiconductor device 100 is improved. In some embodiments of the present invention, the machine model of the ESD protection semiconductor device 100 is improved to −225V, but not limited to this.

Figure 3:
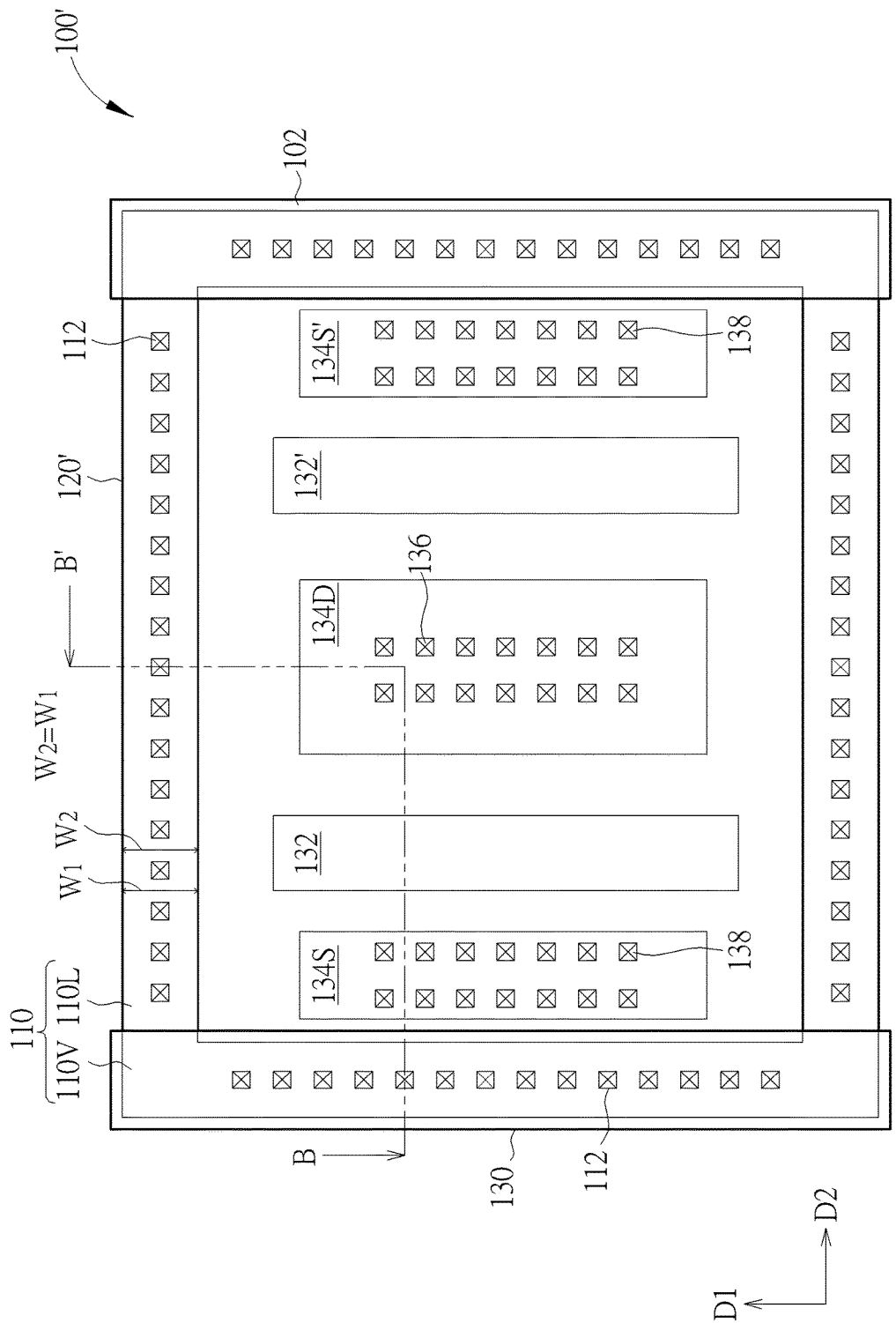
FIG. 3 is a schematic drawing illustrating a layout structure of an ESD protection semiconductor device provided by a second preferred embodiment of the present invention.
Figure 4:
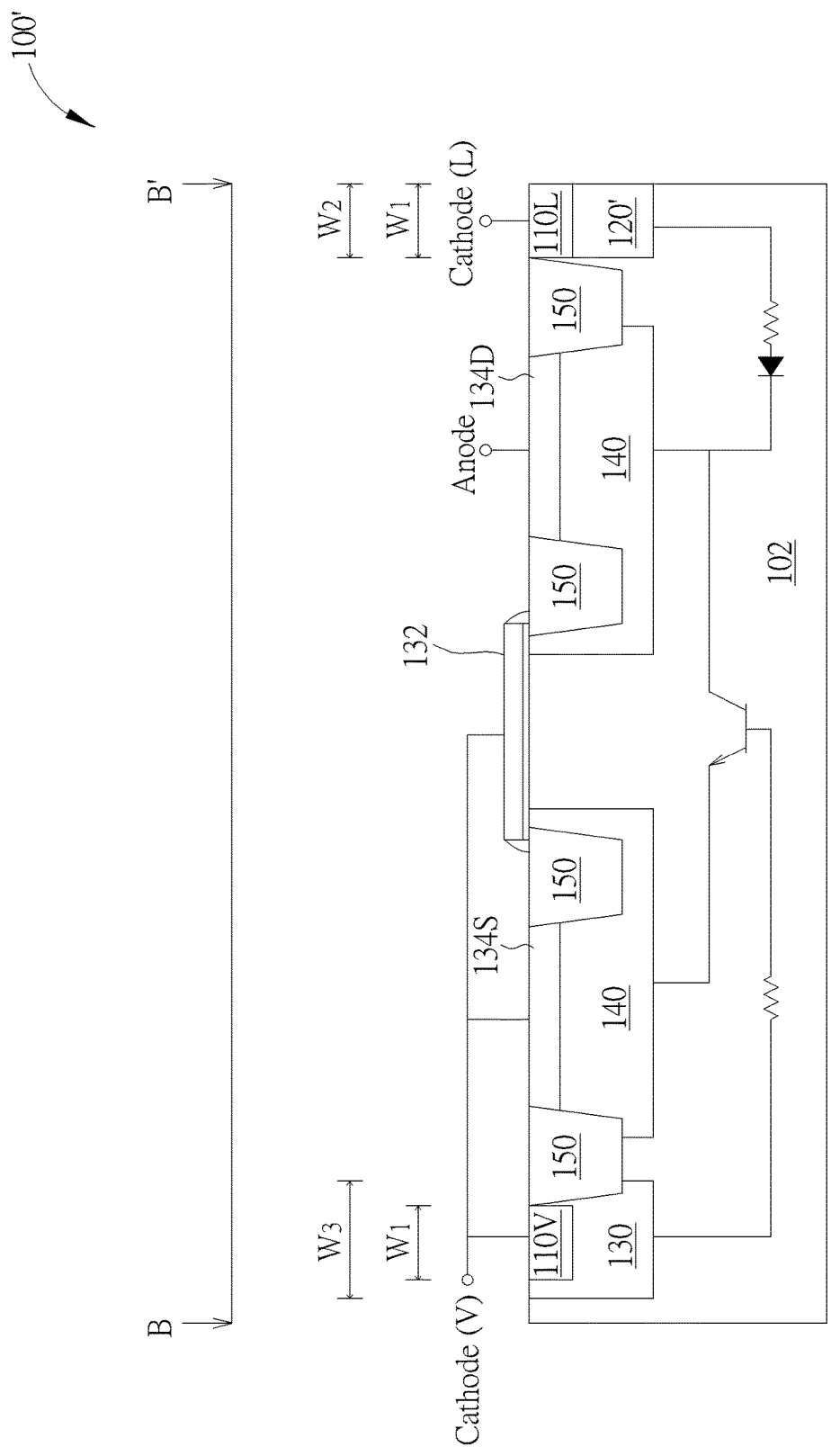
FIG. 4 is a schematic drawing illustrating the ESD protection semiconductor device provided by the second preferred embodiment, and a cross-sectional view taken along a line B-B' of FIG. 3.

Please refer to FIGS. 3 and 4, wherein FIG. 3 is a schematic drawing illustrating a layout structure of an ESD protection semiconductor device provided by a second preferred embodiment of the present invention, and FIG. 4 is a schematic drawing illustrating the ESD protection semiconductor device provided by the second preferred embodiment. Particularly, FIG. 4 is a cross-sectional view taken along a line B-B' of FIG. 3. It should be noted that elements the same in the first and second preferred embodiments are designated by the same numerals, and can include the same materials. Thus, those details are omitted in the interest of brevity. The preferred embodiment provides a layout structure of the ESD protection semiconductor device 100' and an ESD protection semiconductor device 100'. The ESD protection semiconductor device 100' and its layout structure 100' include elements the same with those described in the first embodiment except the pair of second doped regions 120'. The difference between the first and the second embodiment is: A width $W_2$ of the second doped regions 120' is equal to a width $W_1$ of the lateral portions 110L of the first doped region 110.

According to the ESD protection semiconductor device 100' and its layout structure 100', the second doped regions 120' are provided and formed under the lateral portions 110L of the first doped region 110, which are near the two ends of the drain region 134D as shown in FIG. 3. More important, the lateral portions 110L of the first doped region 110, the second doped regions 120', the substrate 102, and the well region 140/the drain region 134D form a SCR as shown in FIG. 4. Consequently, currents are forced to avoid this SCR path. That is, currents are forced to avoid vertical paths between the drain region 134D and the lateral portions 110L of the first doped region 110, and lateral paths between the drain region 134D and the vertical portions 110V of the first doped region 110 are preferred. Since path lengths between the drain contacts 136 and the vertical portions 110V of the first doped region 110 are the same, contact spiking which is often located at the drain contacts 136 around the two ends of the drain region 134D is prevented and thus machine model of the ESD protection semiconductor device 100' is improved. In some embodiments of the present invention, the machine model of the ESD protection semiconductor device 100' is improved to −275V, but not limited to this.

Figure 5:
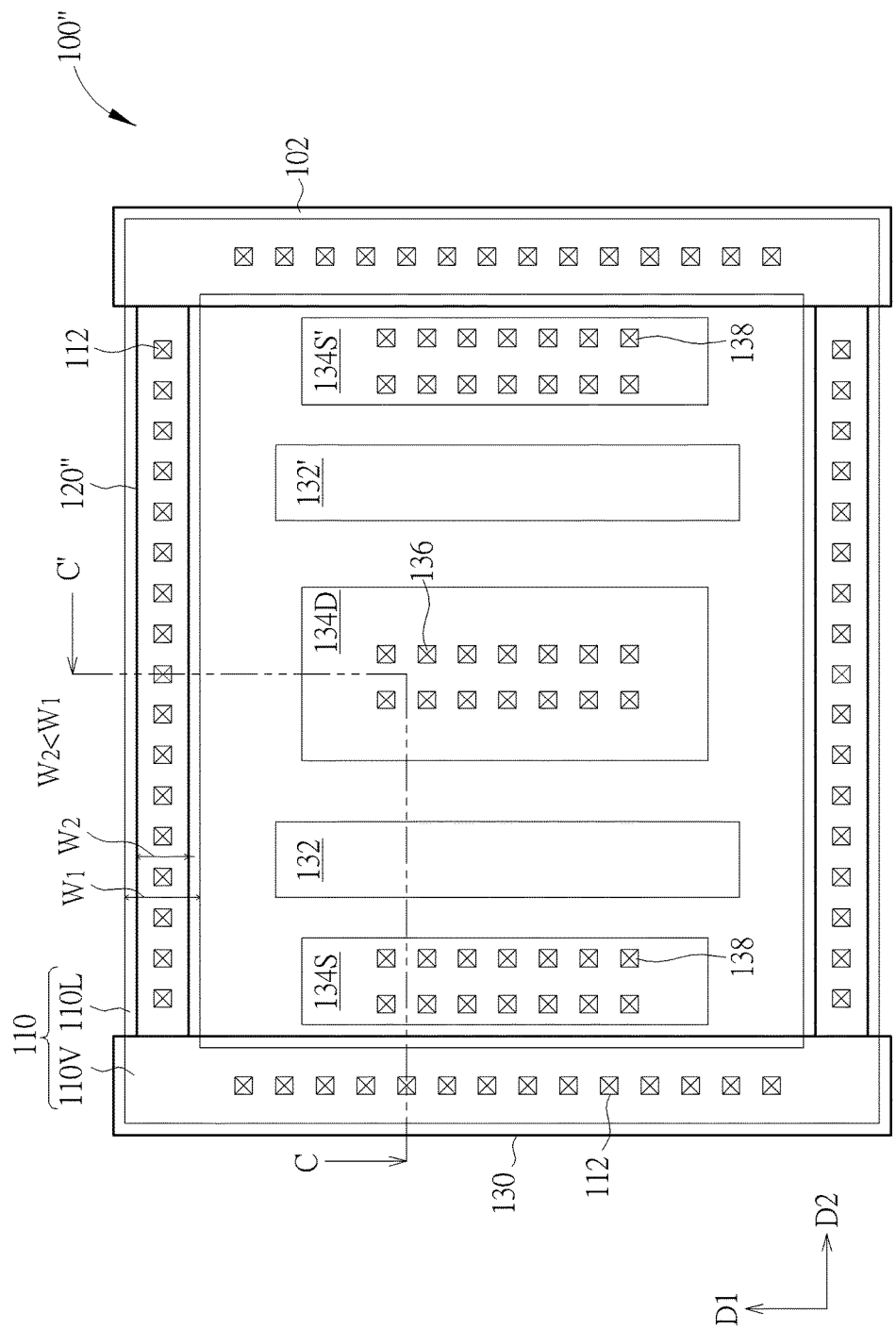
FIG. 5 is a schematic drawing illustrating a layout structure of an ESD protection semiconductor device provided by a third preferred embodiment of the present invention.
Figure 6:
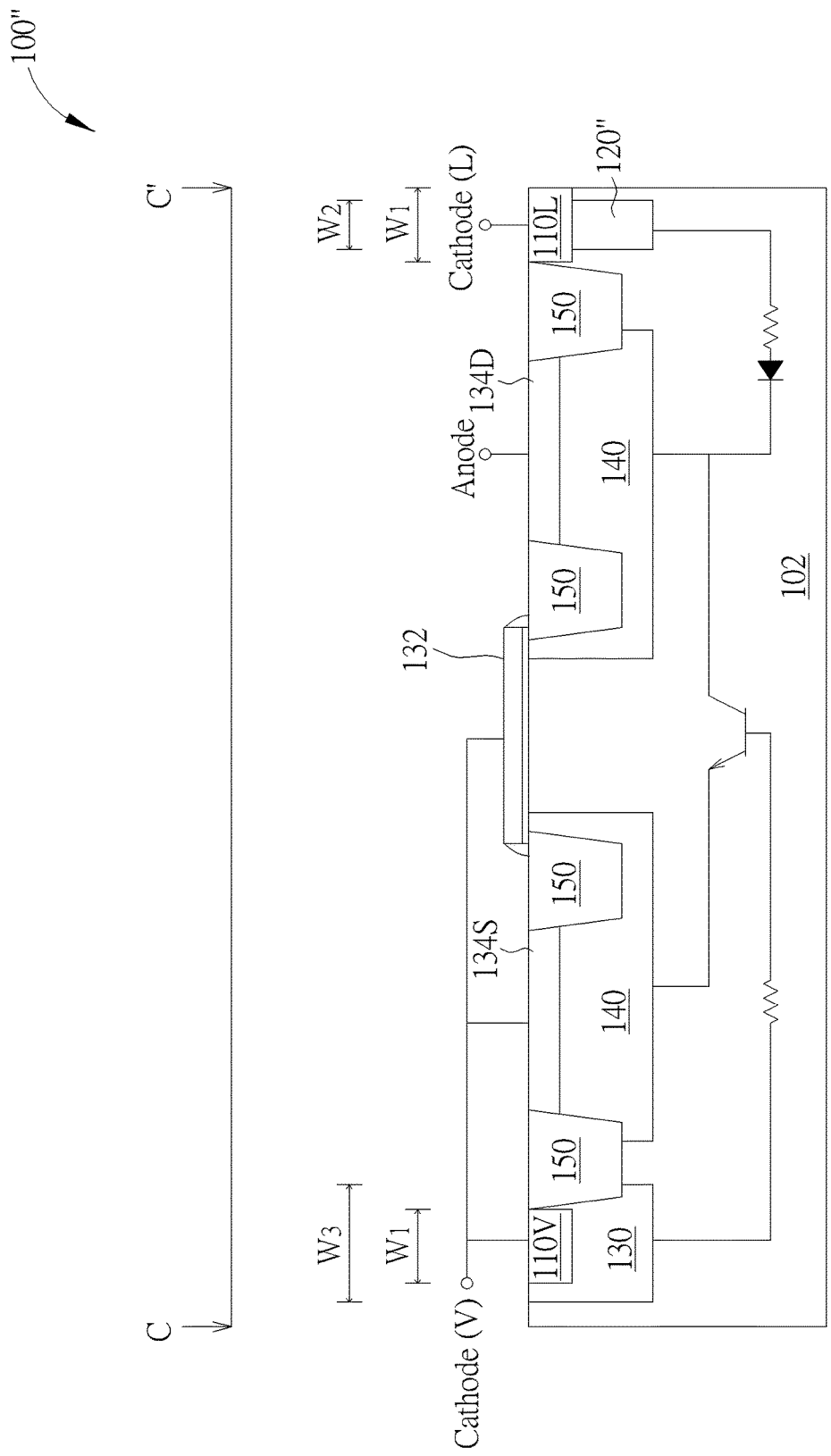
FIG. 6 is a schematic drawing illustrating the ESD protection semiconductor device provided by the third preferred embodiment, and a cross-sectional view taken along a line C-C' of FIG. 5.

Please refer to FIGS. 5 and 6, wherein FIG. 5 is a schematic drawing illustrating a layout structure of an ESD protection semiconductor device provided by a third preferred embodiment of the present invention, and FIG. 6 is a schematic drawing illustrating the ESD protection semiconductor device provided by the third preferred embodiment. Particularly, FIG. 6 is a cross-sectional view taken along a line C-C' of FIG. 5. It should be noted that elements the same in the third and aforementioned preferred embodiments are designated by the same numerals, and can include the same materials. Thus, those details are omitted in the interest of brevity. The preferred embodiment provides a layout structure of the ESD protection semiconductor device 100" and an ESD protection semiconductor device 100". The ESD protection semiconductor device 100" and its layout structure 100" include elements the same with those described in the first embodiment except the pair of second doped regions 120". The difference between the first and the third embodiment is: A width $W_2$ of the second doped regions 120" is smaller than a width $W_1$ of the lateral portions 110L of the first doped region 110.

According to the ESD protection semiconductor device 100" and its layout structure 100", the second doped regions 120" are provided and formed under the lateral portions 110L of the first doped region 110, which are near the two ends of the drain region 134D as shown in FIG. 5. More important, the lateral portions 110L of the first doped region 110, the second doped regions 120", the substrate 102, and the well region 140/the drain region 134D form a SCR as shown in FIG. 6. Consequently, currents are forced to avoid this SCR path. That is, currents are forced to avoid vertical paths between the drain region 134D and the lateral portions 110L of the first doped region 110, and lateral paths between the drain region 134D and the vertical portions 110V of the first doped region 110 are preferred. Since all path lengths between the drain contacts 136 and the vertical portions 110V of the first doped region 110 are all the same, contact spiking which is often located at the drain contacts 136 around the two ends of the drain region 134D is prevented and thus machine model of the ESD protection semiconductor device 100" is improved. In some embodiments of the present invention, the machine model of the ESD protection semiconductor device 100" is improved to be larger than −400V, but not limited to this.

According to the ESD protection semiconductor device and the layout structure of the ESD protection semiconductor device provided by the present invention, the second doped regions, which are complementary to the first doped region, are formed under the pair of lateral portions of the first doped region and thus are near the two ends of the drain region. And a width of the second doped regions can be larger than, equal to, or smaller than a width of the first doped region. Consequently, a SCR is obtained due to the second doped regions. As a result, currents are forced to avoid this SCR path. That is, the currents are forced to avoid vertical paths between the drain region and the lateral portions of the first doped region while lateral paths between the drain region and the lateral portions of the first doped region are preferred. Consequently, contact spiking which is often located at the drain contacts around the two ends of the drain region is prevented and thus machine model of the ESD protection semiconductor device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout structure of an electrostatic discharge (hereinafter abbreviated as ESD) protection semiconductor device comprising:
a substrate comprising a first conductivity type;
a first doped region comprising the first conductivity type, the first doped region comprising a pair of lateral portions and a pair of vertical portions, the pair of lateral portions and the pair of vertical portions being perpendicular to each other to form a frame in the substrate;
a pair of second doped regions formed under only the pair of lateral portions of the first doped region, the pair of the second doped regions comprising a second conductivity type, and the second conductivity type being complementary to the first conductivity type;
a pair of third doped regions formed under only the pair of vertical portions of the first doped region, the pair of third doped regions comprising the first conductivity type;
at least a first gate structure formed on the substrate within the first doped region; and
a drain region and a first source region formed in the substrate at two sides of the first gate structure, the drain region and the first source region comprising the second conductivity type.

2. The layout structure of the ESD protection semiconductor device according to claim 1, wherein a width of each of the pair of second doped regions is larger than a width of each of the pair of lateral portions of the first doped region.

3. The layout structure of the ESD protection semiconductor device according to claim 1, wherein a width of each of the pair of second doped regions is equal to a width of each of the pair of lateral portions of the first doped region.

4. The layout structure of the ESD protection semiconductor device according to claim 1, wherein a width of each of the pair of second doped regions is smaller than a width of each of the pair of lateral portions of the first doped region.

5. The layout structure of the ESD protection semiconductor device according to claim 1, wherein a width of each of the pair of third doped regions is larger than a width of each of the pair of vertical portions of the first doped region.

6. The layout structure of the ESD protection semiconductor device according to claim 1, further comprising at least a second gate structure formed on the substrate within the first doped region, and the drain region being formed in between the first gate structure and the second gate structure.

7. The layout structure of the ESD protection semiconductor device according to claim 6, further comprising a second source region comprising the second conductivity type, and the first gate structure and the second gate structure being formed in between the first source region and the second source region.

8. The layout structure of the ESD protection semiconductor device according to claim 1, wherein a concentration of the pair of second doped regions is equal to or smaller than a concentration of the drain region and the first source region.

9. The layout structure of the ESD protection semiconductor device according to claim 8, further comprising a well region formed under the drain region.

10. The layout structure of the ESD protection semiconductor device according to claim 9, wherein the concentration of the pair of second doped regions is equal to or larger than a concentration of the well region.

11. The layout structure of the ESD protection semiconductor device according to claim 1, wherein the drain region and the first source region are parallel with the pair of third doped regions and the pair of vertical portions of the first doped region.

12. An ESD protection semiconductor device comprising:
a substrate comprising a first conductivity type;
a gate structure positioned on the substrate;
a drain region and a source region comprising a second conductivity type formed at two sides of the gate structure in the substrate, and the second conductivity type being complementary to the first conductivity type;
a pair of first doped regions formed in the substrate, the pair of first doped regions comprising the first conductivity type, and the gate structure, the drain region and the source region being formed adjacent to the pair of first doped regions, wherein the pair of first doped regions are perpendicular to each other;
a second doped region formed under one of the pair of first doped regions, and the second doped region comprising the second conductivity type, wherein the second doped region is free from overlapping the source region and the drain region, and wherein a width of the second doped region is smaller than a width of the one of the pair of first doped regions; and
a third doped region formed under another one of the pair of first doped regions, and the third doped region comprising the first conductivity type.

13. The ESD protection semiconductor device according to claim 12, wherein a width of the third doped region is larger than a width of the another one of the pair of first doped regions.

14. The ESD protection semiconductor device according to claim 12, wherein a concentration of the second doped region is equal to or smaller than a concentration of the drain region and the source region.

15. The ESD protection semiconductor device according to claim 12, further comprising a well region formed under the drain region.

16. The ESD protection semiconductor device according to claim 15, wherein a concentration of the second doped region is equal to or larger than a concentration of the well region.

* * * * *